(12) United States Patent
Kawano et al.

(10) Patent No.: US 8,148,688 B2
(45) Date of Patent: Apr. 3, 2012

(54) NEAR-FIELD TERAHERTZ WAVE DETECTOR

(75) Inventors: Yukio Kawano, Saitama (JP); Koji Ishibashi, Saitama (JP)

(73) Assignee: Riken, Saitama (JP)

( * ) Notice: Subject to any disclaimer, the term of this patent is extended or adjusted under 35 U.S.C. 154(b) by 442 days.

(21) Appl. No.: 12/351,208

(22) Filed: Jan. 9, 2009

(65) Prior Publication Data

US 2010/0006892 A1 Jan. 14, 2010

(30) Foreign Application Priority Data

Jul. 8, 2008 (JP) .................................. 2008/178041

(51) Int. Cl.
*G01J 5/00* (2006.01)
*G01J 5/20* (2006.01)
*H01L 31/101* (2006.01)

(52) U.S. Cl. .................. 250/338.1; 250/338.4; 257/187; 977/742

(58) Field of Classification Search ................ 250/338.1, 250/338.4, 306, 343, 341.1; 257/187, E31.082; 977/742
See application file for complete search history.

(56) References Cited

U.S. PATENT DOCUMENTS 5,614,743 A * 3/1997 Mochizuki ..................... 257/276
5,894,125 A * 4/1999 Brener et al. .................. 250/330
2005/0230705 A1* 10/2005 Taylor ........................... 257/120
2006/0197021 A1* 9/2006 Ouchi ........................... 250/343
2007/0194225 A1* 8/2007 Zorn ............................. 250/306

OTHER PUBLICATIONS

Hunsche, S. et al., "THz near-field imaging," Optics Communications 150, 1998, pp. 22-26.
Wang, Kanglin et al., "Antenna effects in terahertz apertureless near-field optical microscopy," Applied Physics Letters, vol. 85, No. 14, Oct. 4, 2004, pp. 2715-2717.
Chen, Hou-Tong et al., "Terahertz imaging with nanometer resolution," Applied Physics Letters, vol. 83, No. 15, Oct. 13, 2003, pp. 3009-3011.

* cited by examiner

*Primary Examiner* — David Porta
*Assistant Examiner* — Faye Boosalis
(74) *Attorney, Agent, or Firm* — Griffin & Szipl, P.C.

(57) ABSTRACT

A near-field terahertz wave detector comprises a semiconductor chip (12) whose longitudinal electrical resistance along its surface changes due to a near-field wave of a terahertz wave (1), an insulating film (18) which covers the surface of the semiconductor chip, and a conductive film (20) able to shield the terahertz wave by covering the surface of the insulating film. The conductive film (20) has an aperture (21) whose maximum size is one digit or more smaller than the wavelength of the terahertz wave. Further, a planar conductive probe (14) is provided between the conductive film (20) and the semiconductor chip (12). The conductive probe (14) is insulated from the conductive film (20) by the insulating film (18), and a tip (14a) of the conductive probe (14) is located inside the aperture (21). It is possible to increase a signal-to-noise ratio by significantly reducing the effect of a far-field wave, thereby enabling a near-field wave to be detected with high efficiency and increasing the resolution of an object by the near-field wave to one tenth or less of the wavelength.

6 Claims, 8 Drawing Sheets

NEAR-FIELD TERAHERTZ WAVE DETECTOR

This application claims priority from Japanese Patent Application No. 178041/2008, filed Jul. 8, 2008, the entire disclosure of which is incorporated herein by reference.

BACKGROUND OF THE INVENTION

1. Field of the Invention

The present invention relates to a near-field terahertz wave detector having a spatial resolution beyond the diffraction limit in terahertz waves.

2. Description of the Related Art

In the present invention, the term "terahertz wave" means an electromagnetic wave whose frequency is in the range of 1 to 10 THz (1 THz=$10^{12}$ Hz), in other words, whose wavelength is in the 0.03 mm to 0.3 mm submillimeter-wave to far-infrared region.

The terahertz wave is expected to be applied in a wide range of fields extending from basic research such as radio astronomy, materials science, and biomolecular spectroscopy to practical applications such as security, information communication, environment, and medical care.

Particularly, an imaging technique using terahertz waves (hereinafter, referred to as "THz imaging technique") is expected to be a powerful measurement tool in the fields such as a human body test, materials evaluation, and the like, since the terahertz waves have characteristic properties such as moderately passing through materials opaque to visible light and having photon energy that belongs to an important energy range of meV for various materials.

The terahertz wave, however, is an electromagnetic wave having a frequency band between light such as infrared radiation, visible light, and UV radiation (frequency: $10^{13}$ to $10^{15}$ Hz) and a radio wave (frequency: $10^3$ to $10^{12}$ Hz), which leads to a problem that it is impossible to directly use the existing techniques of optics and electronics to the terahertz wave.

Particularly in the THz imaging technique, there is a problem that the spatial resolution is relatively low in comparison with the visible light since the wavelength of the terahertz wave is relatively long in comparison with the visible light and the spatial resolution is limited to the order of one half of the wavelength due to the diffraction limit.

Accordingly, the use of a near-field wave is considered as a means for implementing THz imaging having high spatial resolution beyond the diffraction limit.

The term "near-field wave" means light extremely thinly clinging to the surface of an object and has a property of not propagating in a space like the normal light. For example, it is known that totally-reflected light oozes out of the boundary surface into the air at a total reflection point in a prism. The light oozing into the air is called a near-field wave or an evanescent wave.

Although a standard optical microscope magnifies light from an object using a lens, the magnification is limited by the wavelength of light (the wavelength of visible light is in a range of approx. 0.38 to 0.77 µm) and the standard optical microscope is capable of resolving only up to approx. 0.5 µm. It is referred to as "diffraction limit" of light waves.

The near-field wave, however, does not propagate in a space like the normal light and therefore is not affected by the diffraction limit. Therefore, it is possible to achieve a microscope having a resolution beyond the diffraction limit by using the near-field waves.

Nonpatent Documents 1 to 3 have already disclosed examples of the THz imaging using the near-field waves.

[Nonpatent Document 1]
S. Hunsche et al., "THz near-field imaging," Optics Communications 150 (1998) 22-26

[Nonpatent Document 2]
Wang et al., "Antenna effects in terahertz apertureless near-field optical microscopy," Appl. Phys. Lett., Vol. 85, No. 14, 4 Oct. 2004

[Nonpatent Document 3]
Chen, Kerstingm and Cho, "Terahertz imaging with nanometer resolution," Appl. Phys. Lett., Vol. 83, No. 15, 13 Oct. 2003

For the visible and near infrared regions, there are well established techniques utilizing a small aperture or a small scatterer with a tapered optical fiber or an STM/AFM probe used therefor. In the terahertz region, however, it has been difficult to use the near-field wave due to the wavelength two or three digits longer than the visible light or the absence of a practical waveguide equivalent to an optical fiber.

The conventional THz imaging using near-field waves described above is roughly divided into an aperture type (Nonpatent Document 1) and an apertureless type (Nonpatent Documents 2 and 3).

In the aperture type, the terahertz wave is focused to a small aperture by using a waveguide or lens and the near-field wave is scattered at the small aperture to detect a near-field wave passing through an object close to the near-field wave by using a detector, by which an image of the object is formed.

In the apertureless type, a probe tip is irradiated with a terahertz wave and a near-field wave is formed at the tip to detect a near-field wave passing through or reflected on the object close to the near-field wave by using a detector, by which an image of the object is formed.

In the conventional apertureless THz imaging using near-field waves, the detector detects a strong far-field wave (an electromagnetic wave propagating in a free space) in addition to a weak near-field wave and therefore a signal-to-noise ratio decreases due to the effect of the far-field wave, which leads to a problem that high-efficiency detection is not achieved.

Moreover, in Nonpatent Document 1 disclosing the aperture THz imaging, the resolution is only one quarter of the wavelength or so and a resolution higher by one digit or more could not be stably obtained, though the near-field wave is used.

SUMMARY OF THE INVENTION

The present invention has been devised to solve the above problems. Therefore, it is an object of the present invention to provide a near-field terahertz wave detector capable of increasing a signal-to-noise ratio by significantly reducing the effect of a far-field wave, thereby detecting a near-field wave with high efficiency and increasing the resolution of an object by the near-field wave to one tenth or less of the wavelength.

According to the present invention, there is provided a near-field terahertz wave detector, comprising: a semiconductor chip whose longitudinal electrical resistance along its surface changes due to a near-field wave of a terahertz wave; an insulating film which covers the surface of the semiconductor chip; and a conductive film able to shield the terahertz wave by covering the surface of the insulating film, wherein the conductive film has an aperture whose maximum size is one digit or more smaller than the wavelength of the terahertz wave and wherein a planar conductive probe is provided between the conductive film and the semiconductor chip, the conductive probe is insulated from the conductive film by the insulating film, and a tip of the conductive probe is located inside the aperture.

According to a preferred embodiment of the present invention, a pair of the conductive probes are in close contact with the surface of the semiconductor chip and the tips of the conductive probes are opposed to each other with a gap between the tips which is one digit or more smaller than the wavelength of the terahertz wave.

According to a preferred first embodiment of the present invention, the semiconductor chip is a high electron mobility transistor (HEMT) in which a two-dimensional electron gas is formed in a given position from the surface, and the near-field terahertz wave detector further comprises: conductive source and drain electrodes which are spaced apart from each other on the longitudinal outside of the pair of conductive probes placed between the source electrode and the drain electrode, both of which are disposed in close contact with the surface of the semiconductor chip; and a voltage measuring device which detects a change in voltage between the source electrode and the drain electrode by applying a certain electric current therebetween.

According to a preferred second embodiment of the present invention, the semiconductor chip includes a semiconductor substrate and a carbon nanotube which is located on the surface of the semiconductor substrate and whose longitudinal electrical resistance along the surface changes due to the near-field wave of the terahertz wave, and the near-field terahertz wave detector further comprises: conductive source and drain electrodes which are connected to both longitudinal ends of the carbon nanotube and disposed in close contact with the surface of the semiconductor substrate; and a current measuring device which detects a change in current between the source electrode and the drain electrode by applying a certain voltage therebetween.

Further, preferably the semiconductor chip, the source electrode, the drain electrode, the conductive probes, the insulating film, and the conductive film are formed together and integrated in this order.

According to the constitution of the present invention, the surface of the semiconductor chip, whose longitudinal electrical resistance along the surface changes due to the near-field wave of the terahertz wave, is covered with the conductive film that shield the terahertz wave, and the maximum size of the aperture of the conductive film is one digit or more smaller than the wavelength of the terahertz wave.

Therefore, even if the terahertz wave is radiated toward the aperture of the conductive film, the terahertz wave having a long wavelength is almost not able to pass through the aperture due to the diffraction limit, which causes a situation where the near-field wave is localized close to the aperture.

Moreover, the planar conductive probe is provided between the conductive film and the semiconductor chip, the conductive probe is insulated from the conductive film by the insulating film, and the tip of the conductive probe is located inside the aperture in the present invention. Therefore, the presence of the conductive probe changes the electric field distribution in the vicinity of the aperture and produces a large electric field extending effect. The electric field extending effect is confirmed by the analysis and experiment described later.

Accordingly, it is possible to extend the near-field wave (the electric field distribution of the evanescent wave) generated in the vicinity of the aperture whose maximum size is one digit or more smaller than the wavelength to the probe tip located in the inner lower side of the aperture and to thereby detect the resistance change of the two-dimensional electron gas (or the carbon nanotube) that is located just below the surface.

Therefore, according to the constitution of the present invention, the far-field waves other than the near-field waves are almost not able to pass through the aperture and negligible transmitted light only passes under the two-dimensional electron gas, thereby not affecting the resistance change of the two-dimensional electron gas (or the carbon nanotube). Therefore, it is possible to increase a signal-to-noise ratio by significantly reducing the effect of the far-field wave, thereby enabling a near-field wave to be detected with high efficiency.

Further, it is possible to set the maximum size of the aperture to a value one digit or more smaller than the wavelength of the terahertz wave, and the size determines the resolution of the object by the near-field wave. Therefore, the experiment proved that it is possible to increase the resolution to one tenth or less of the wavelength of the terahertz wave.

DESCRIPTION OF THE PREFERRED EMBODIMENTS

The preferred embodiments of the present invention will now be described in detail hereinafter with reference to the accompanying drawings. The same reference numerals refer to the same parts throughout the various figures and redundant description will be omitted.

Figure 1:
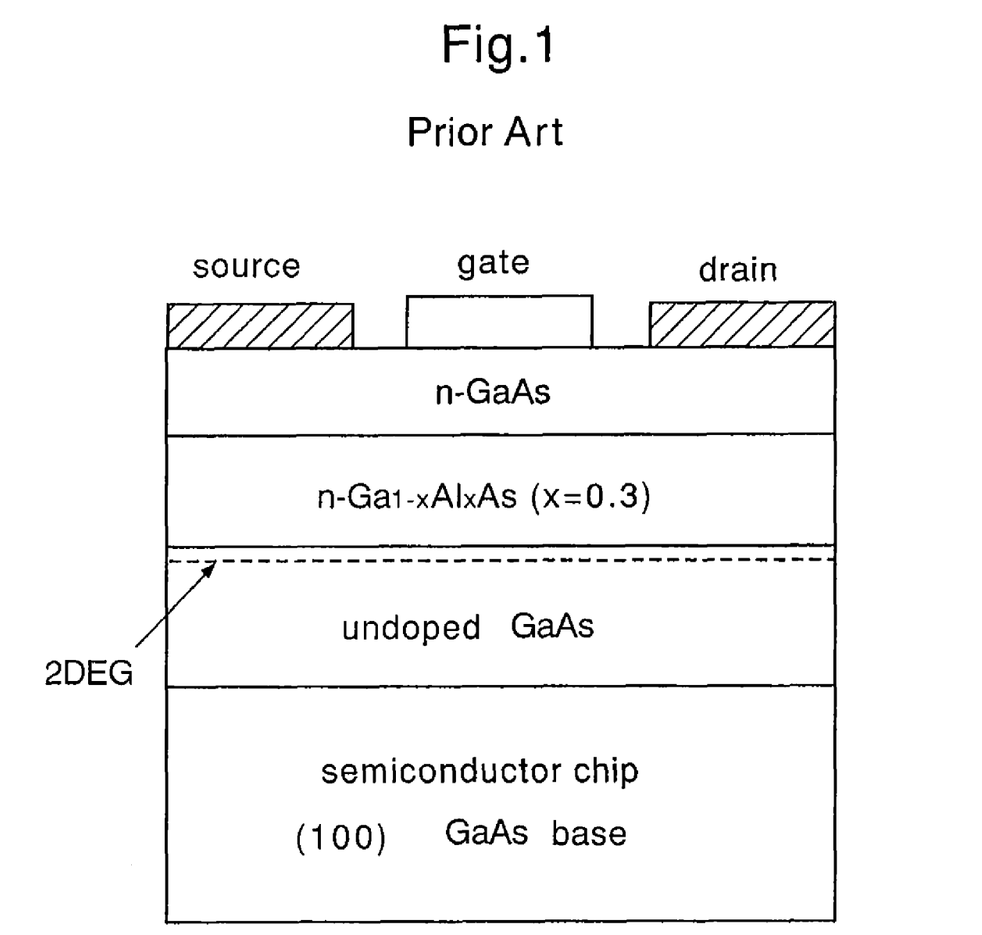
FIG. 1 is an explanatory diagram of a high electron mobility transistor (HEMT).

Referring to FIG. 1, there is shown an explanatory diagram of a high electron mobility transistor (HEMT), which is used in the present invention.

The HEMT is a transistor using a two-dimensional electron gas (simply referred to as "2DEG"), wherein the two-dimensional electron gas is formed by modulation doping and an electron transfer rate is high. Therefore, it is possible to control the electron current, which flows from source to drain, at a high speed by using the high electron transfer rate.

The term "two-dimensional electron gas" is electrons that move along a junction interface between a semiconductor and an insulator or between different kinds of semiconductors, in other words, dilute electrons having a momentum only in a two-dimensional plane.

Figure 2:
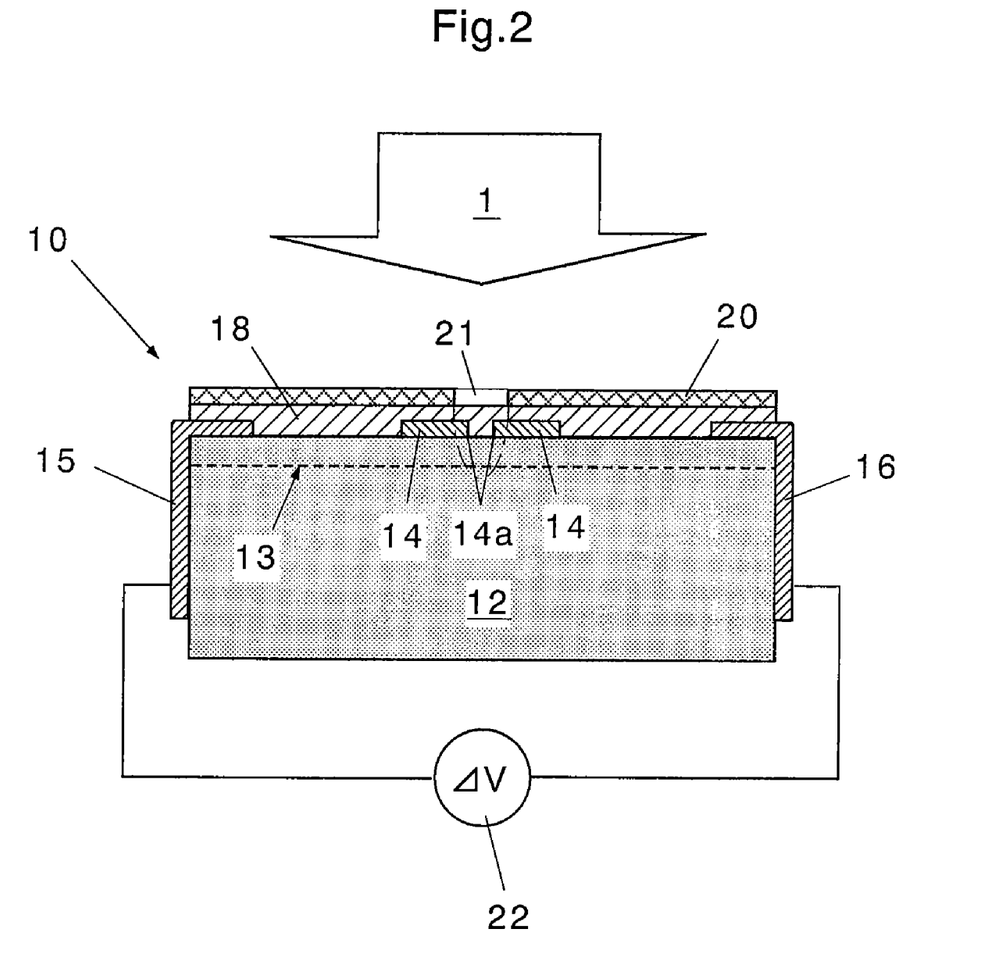
FIG. 2 is a diagram illustrating a first embodiment of a near-field terahertz wave detector according to the present invention.

Referring to FIG. 2, there is shown a diagram illustrating a first embodiment of a near-field terahertz wave detector according to the present invention.

As shown in this figure, the near-field terahertz wave detector 10 includes a semiconductor chip 12, a pair of conductive probes 14, a source electrode 15, a drain electrode 16, an insulating film 18, and a conductive film 20.

The semiconductor chip 12 has a property that a longitudinal electrical resistance along the surface changes due to a near-field wave 2 of a terahertz wave 1.

In this example, the semiconductor chip 12 is the aforementioned HEMT in which a two-dimensional electron gas 13 is formed in a given position (at a certain distance) from the surface. The HEMT without a gate, a source, and a drain in FIG. 1 is referred to as the semiconductor chip 12 here.

Although the distance from the surface of the two-dimensional electron gas 13 is approx. 60 nm in the embodiment described later, the distance may be either less than or greater than 60 nm.

Moreover, the semiconductor chip 12 is not limited to the HEMT, but may be any other semiconductor chip as long as it has the property that the longitudinal electrical resistance along the surface changes due to the near-field wave 2 of the terahertz wave 1.

The pair of conductive probes 14 are planar and located in close contact with the surface of the semiconductor chip 12, with the tips 14a opposed to each other with a gap between the tips which is one digit or more smaller than the wavelength λ of the terahertz wave 1.

In an example described later, the conductive probe 14 is a 100-nm thick Au thin film. The number of conductive probes 14 is not limited to a pair, but may be either one or three or more as long as each conductive probe is insulated from the conductive film 20 by the insulating film 18 and the tip 14a is located inside an aperture 21 (described later).

The source electrode 15 and the drain electrode 16 are spaced apart from each other in the longitudinal outside of the pair of conductive probes 14 placed between the source electrode 15 and the drain electrode 16, both of which are disposed in close contact with the surface of the semiconductor chip 12 and the longitudinal end surfaces thereof.

In the example described later, the source electrode 15 and the drain electrode 16 are 120-nm thick AuGe/Ni/Au alloy films.

The insulating film 18 is a film with a high electrical resistance that covers the surfaces of the conductive probes 14, the source electrode 15, and the drain electrode 16.

In the example described later, the insulating film 18 is a 50-nm thick $SiO_2$ film.

The conductive film 20 covers the surface of the insulating film 18 to shield the terahertz wave 1.

In the example described later, the conductive film 20 is a 200-nm thick Au film.

In FIG. 2, the conductive film 20 has the aperture 21 for forming a near-field wave of the terahertz wave 1 in a position enclosing the tips 14a of the conductive probes 14. More specifically, the center position of the aperture 21 coincides with the center of the pair of tips 14a and the outer edge of the aperture 21 is located in the outside of the pair of tips 14a. In this instance, the insulating film 18 exists between the aperture 21 and the conductive probes 14.

Moreover, the maximum size of the aperture 21 is set to a value that is one digit or more smaller than the wavelength λ of the terahertz wave 1 and greater than the distance between the tips 14a of the conductive probes 14.

In the example described later, the aperture 21 is an 8-μm diameter circular hole, and the tips 14a of the conductive probes 14 are spaced 2 to 3 μm apart. The aperture 21 is not limited to the circular hole, but may be either a rectangular hole or any other shaped hole.

In the above near-field terahertz wave detector 10, the semiconductor chip 12, the source electrode 15, the drain electrode 16, the conductive probes 14, the insulating film 18, and the conductive film 20 are formed together and integrated in this order by a known semiconductor manufacturing process.

In FIG. 2, the near-field terahertz wave detector 10 according to the present invention further includes a voltage measuring device 22 which detects a voltage change between the source electrode 15 and the drain electrode 16 by applying a certain electric current therebetween.

EXAMPLE I (Manufacturing Method)

The near-field terahertz wave detector 10 shown in FIG. 2 was manufactured by the following method.

(1) The semiconductor chip 12 with a length of 3 mm and a width of 2 mm was cut from a GaAs/AlGaAs heterostructure wafer. This wafer has an electron mobility of 18 (0.5) $m^2$/Vs and a sheet electron density of 4.4 (11)$\times 10^{15}$ $m^{-2}$ at 77K (at 300K).

(2) The two-dimensional electron gas 13 was formed into a rectangular shape of 1 mm length and 0.1 mm width by standard photolithography and wet etching.

(3) Two electrodes (the source electrode 15 and the drain electrode 16), made from a AuGe/Ni/Au alloy film with a total thickness of 120 nm, were deposited on both ends of the semiconductor chip 12 and in the longitudinal outside of the pair of conductive probes 14 with the pair of conductive probes 14 put between the electrodes. The two electrodes were extended to the longitudinal ends of the semiconductor chip 12 and annealed so as to be ohmic electrodes to the two-dimensional electron gas.

(4) Subsequently, the chip surface was sequentially covered with the pair of conductive probes 14 (a 100-nm thick Au film), the insulating film 18 (a 50-nm thick $SiO_2$ film), and the conductive film 20 with the aperture 21 (a 200-nm thick Au film and a circular hole with a diameter of 8 μm).

(5) The two electrodes were each connected to the voltage measuring device 22 via an electrical wire.

Figure 3:
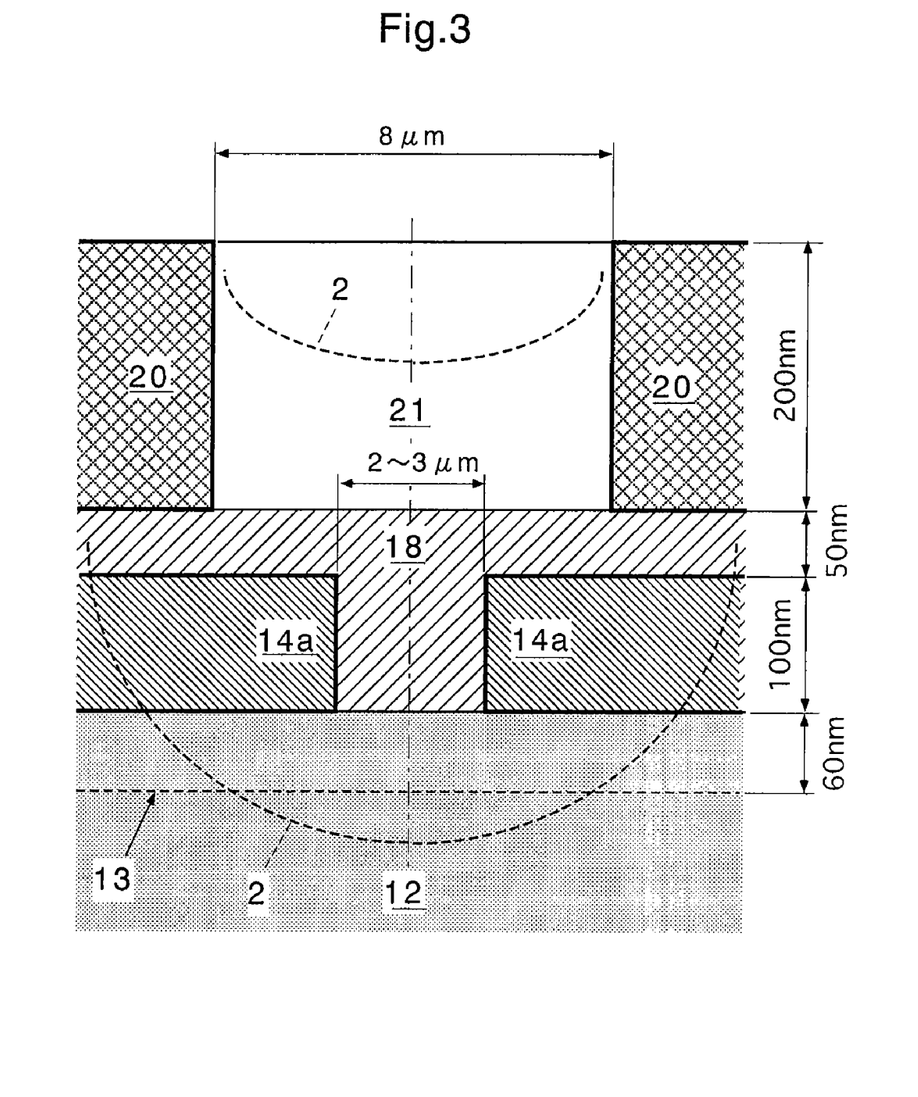
FIG. 3 is an enlarged sectional view of a vicinity of an aperture of a manufactured detector 10.
Figure 4A:
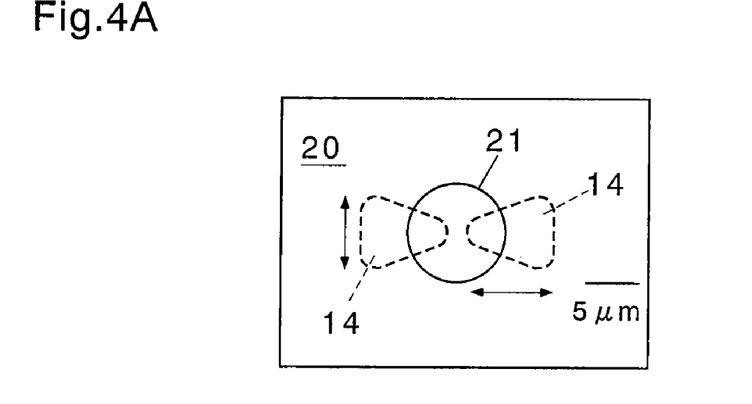
FIG. 4A is a plan view of the vicinity of the aperture of the manufactured detector 10.
Figure 4B:
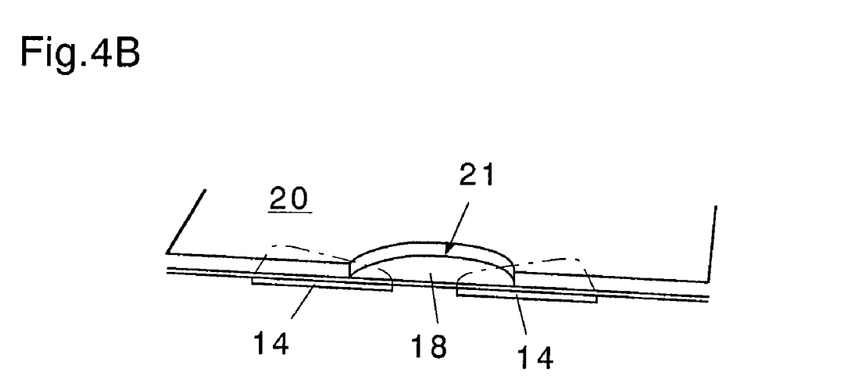
FIG. 4B is a perspective view of the vicinity of the aperture of the manufactured detector 10.
Figure 4C:
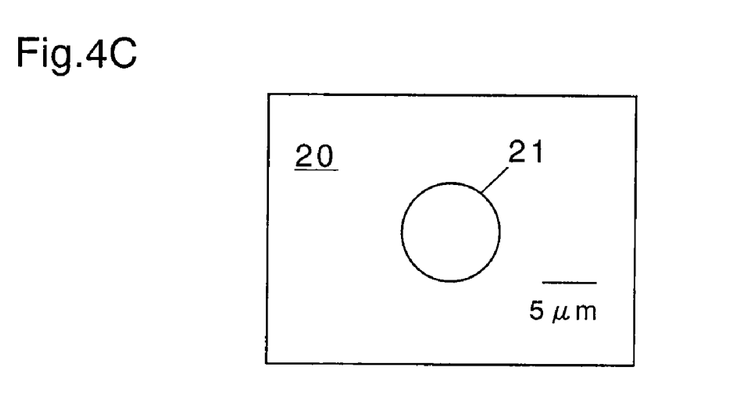
FIG. 4C is a plan view of a device of a comparative example without conductive probes 14.

Referring to FIG. 3, there is shown an enlarged sectional view of a vicinity of the aperture of the manufactured detector 10. FIG. 4A shows a plan view of the vicinity of the aperture of the manufactured detector 10 and FIG. 4B shows a perspective view thereof. In addition, FIG. 4C shows a view similar to FIG. 4A though without the conductive probes 14 as a comparative example.

FIG. 4A is based on a photomicrograph of the vicinity of the aperture of the near-field terahertz wave detector 10 actually manufactured.

In FIG. 4A and FIG. 4B, the conductive probes 14 are deposited on the surface of a single GaAs/AlGaAs heterostructure substrate and are covered with the conductive film 20 having the aperture 21 with the $SiO_2$ insulating film 18 put between the conductive probes 14 and the conductive film 20.

In this device, the two-dimensional electron gas 13 at the GaAs/AlGaAs heterointerface is a detection unit. In the device mechanism, the conductive probes 14 extends the electric field of the near-field wave, which was generated at the aperture 21 sufficiently smaller than the wavelength in size, to the two-dimensional electron gas 13 side to measure the electric field on the basis of a resistance change of the two-dimensional electron gas 13 that is located just below the surface (60 nm below the surface) (See FIG. 2).

In this device, the near-field wave 2 is directly detected by the detector (the resistance change of the two-dimensional electron gas 13) existing nearby. This allows high-efficiency detection with less effect of the far-field wave than the conventional case where a distant detector detects a transmitted or scattered terahertz wave by using the near-field probe.

In FIG. 4A, the aperture 21 is an 8 μm diameter circular hole, and the pair of conductive probes 14 each have a triangular shape of approx. 8 μm length, approx. 7 μm width, and 1 to 1.5 μm tip radius. Moreover, the tips 14a are spaced 2 to 3 μm apart.

(Numerical Analysis)

Figure 5A:
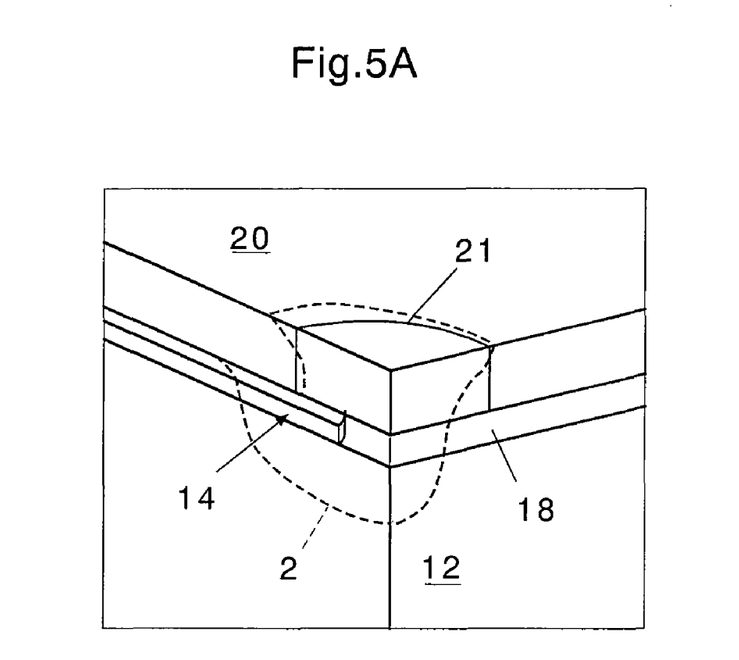
FIG. 5A is a diagram illustrating an analysis result of an electric field distribution near the aperture of the present invention.
Figure 5B:
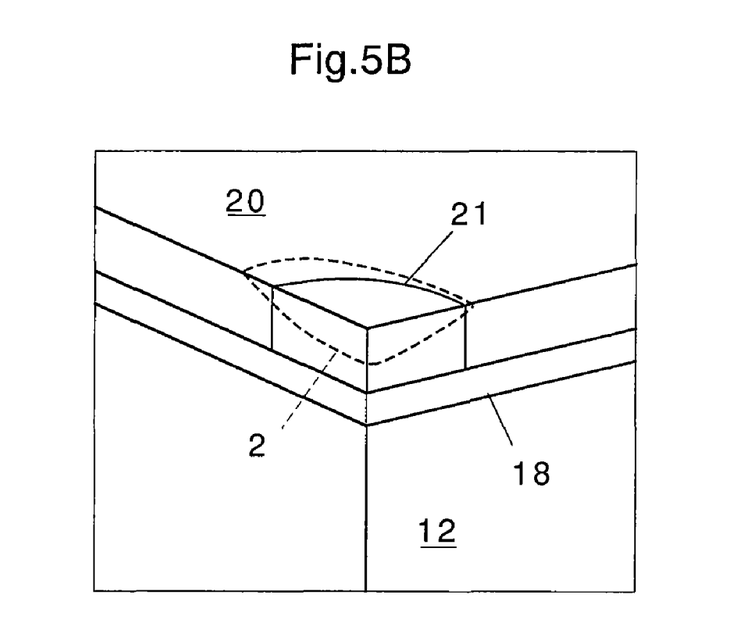
FIG. 5B is a diagram illustrating an analysis result of an electric field distribution near the aperture of the comparative example.

FIG. 5A and FIG. 5B each show an analysis result of an electric field distribution near the aperture shown in FIG. 2. The numerical analysis was performed using known field analysis software based on a finite element method. In this calculation of the numerical analysis, we set the wavelength of the terahertz wave 1 at 200 μm.

FIG. 5A shows the electric field distribution near the aperture of the present invention and FIG. 5B shows the electric field distribution near the aperture of the comparative example shown in FIG. 4C. In this figure, an area of high electric field strength (in other words, an area of detectable electric field strength) is indicated by a dashed line on the basis of an actual analysis result.

As a result of comparison between FIG. 5A and FIG. 5B, it is understood that the presence of the conductive probes 14 spatially modulates the electric field distribution of the near-field wave 2 and thus extends the electric field distribution longer (to the inside of the semiconductor chip 12) in the present invention (FIG. 5A).

(Experiment)

The manufactured near-field terahertz wave detector 10 of the present invention and the detector (See FIG. 4C) of the comparative example were mounted in a $^4$He cryostat cooled down and maintained at 13K, and the sample was irradiated with a terahertz wave through an optical window made from a Mylar sheet.

As a terahertz-wave source, we used a terahertz gas laser pumped by a $CO_2$-gas laser. The output power of the terahertz gas laser was 10 mW.

The terahertz wave was focused with a lens and the sample was irradiated with the terahertz wave. Further, we placed a black polyethylene filter on the optical window to shield visible light.

Considering the focus size of the terahertz wave is approx. 1 $mm^2$, we estimate that the intensity of the terahertz wave at the sample is approx. 630 $\mu W/mm^2$.

A constant current of 80 μA was passed through the near-field terahertz wave detector 10 of the present invention and the 2DEG of the comparative example to detect a voltage change in the current.

We used a line-and-space sample with a 50 μm width of a transparent region and an 80 μm width of an opaque region as a sample and maintained the sample in a given position from the surface of the detector while moving the detector along the surface of the sample to measure the transmission intensity distribution of the terahertz wave.

Figure 6A:
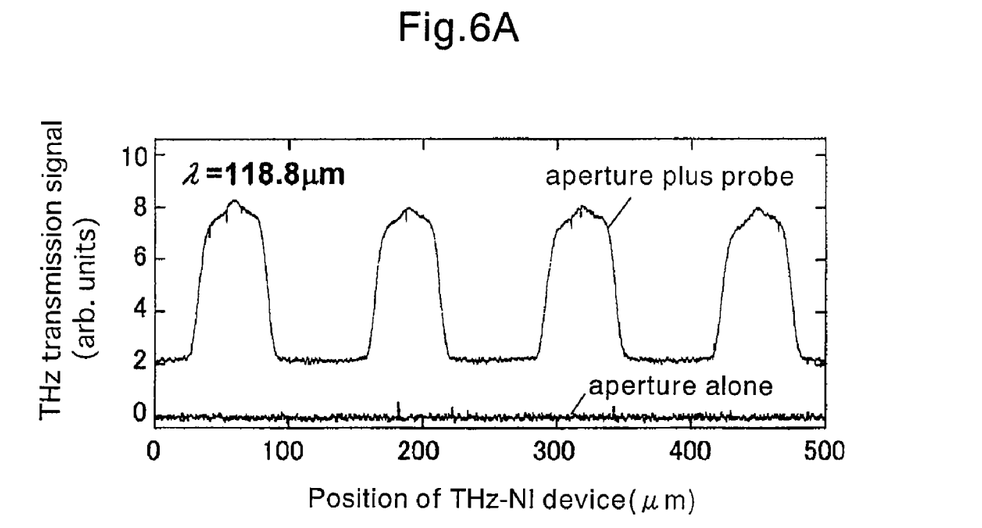
FIG. 6A is an experimental result in the case where the wavelength λ of a terahertz wave is 118.8 μm.
Figure 6B:
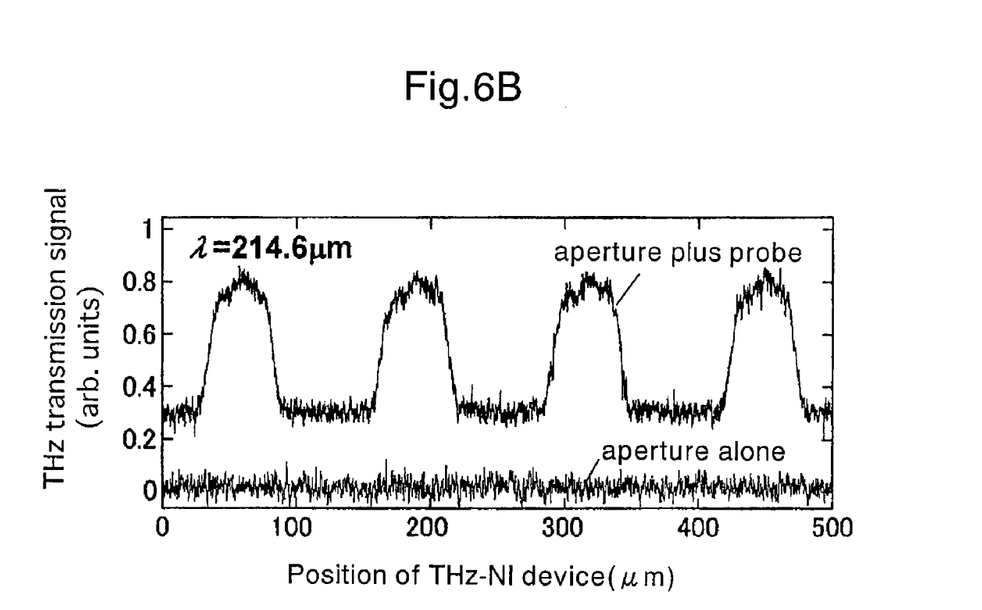
FIG. 6B is an experimental result in the case where the wavelength λ of the terahertz wave is 214.6 μm.

FIG. 6A and FIG. 6B each show an experimental result obtained in the above experiment. The detector of the present invention and that of the comparative example will be hereinafter referred to as "THz-NI device."

FIG. 6A shows the result in the case where the wavelength λ of the terahertz wave is 118.8 μm, and FIG. 6B shows the result in the case where the wavelength λ of the terahertz wave is 214.6 μm. In each figure, the abscissa axis represents the position of the THz-NI device, in other words, a moving distance of the THz-NI device, while the ordinate axis represents a transmission intensity of the terahertz wave. The transmission intensity of the terahertz wave corresponds to a voltage change in the two-dimensional electron gas.

Moreover, in each figure, the substantially horizontal straight-line data at the bottom of the figure is data of the detector of the comparative example having an aperture alone, and the upper periodically changing data is data of the near-field terahertz wave detector 10 of the present invention.

From this figure, a clear profile was observed in the case of the aperture plus the probe (the upper data) in comparison with the case of the aperture alone (the lower data) and a large electric field extending effect expected from the calculation result was confirmed.

Figure 7A:
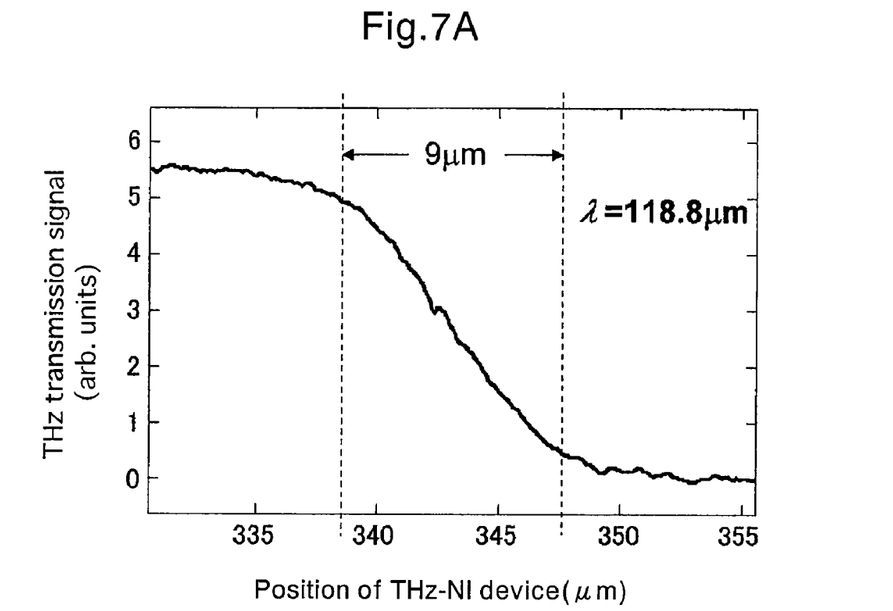
FIG. 7A is a diagram illustrating a resolution based on the experimental result of FIG. 6A.
Figure 7B:
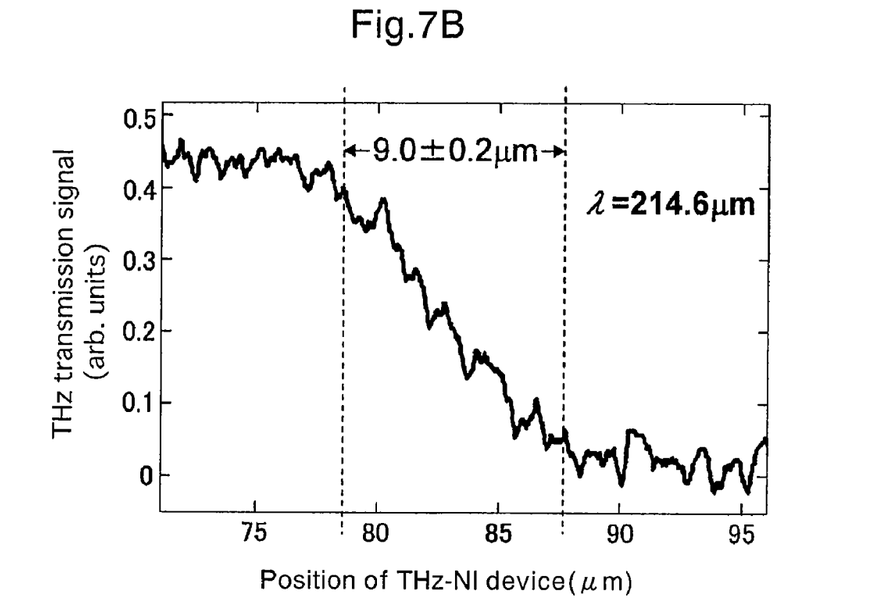
FIG. 7B is a diagram illustrating a resolution based on the experimental result of FIG. 6B.

Referring to FIG. 7, there is shown a diagram illustrating a resolution based on the experimental results of FIG. 6A and FIG. 6B. In this figure, the arrows indicate the range of a signal output of 10% to 90% in the data of the near-field terahertz wave detector 10 of the present invention in FIG. 6A and FIG. 6B.

From this figure, it is proved that the spatial resolution of the near-field terahertz wave detector 10 of the present invention is approx. 9 μm both for the terahertz wavelength λ of 118.8 μm and that of 214.6 μm and therefore the spatial resolution is independent of the terahertz wavelength.

Moreover, the value of approx. 9 μm is equivalent to approx. one twenty-fourth of the wavelength of 214.6 μm and substantially coincides with an aperture diameter. These facts suggest that the near-field terahertz wave detector 10 of the present invention does not depend on the terahertz wavelength, thereby achieving the near-field THz imaging beyond the diffraction limit.

As described hereinabove, the detector of the present invention is characterized in that all components (the semiconductor chip, the source electrode, the drain electrode, the conductive probes, the insulating film, and the conductive film) required for the near-field wave measurement are integrated into a semiconductor chip.

In this specification, the probe tip widely extends the electric field distribution (originally localized in a part) of the near-field wave 2 generated in the aperture which is sufficiently smaller in size than the wavelength so as to measure the electric field on the basis of a resistance change of the two-dimensional electron gas 13 that is located just below the surface (60 nm below the surface). This device is capable of directly detecting the near-field wave 2 by using the detector existing nearby (the resistance change of the two-dimensional electron gas 13). Therefore, it is possible to expect high-efficiency detection with less effect of the far-field wave than the conventional case where a distant detector detects a transmitted or scattered electromagnetic wave by using the near-field probe.

Figure 8:
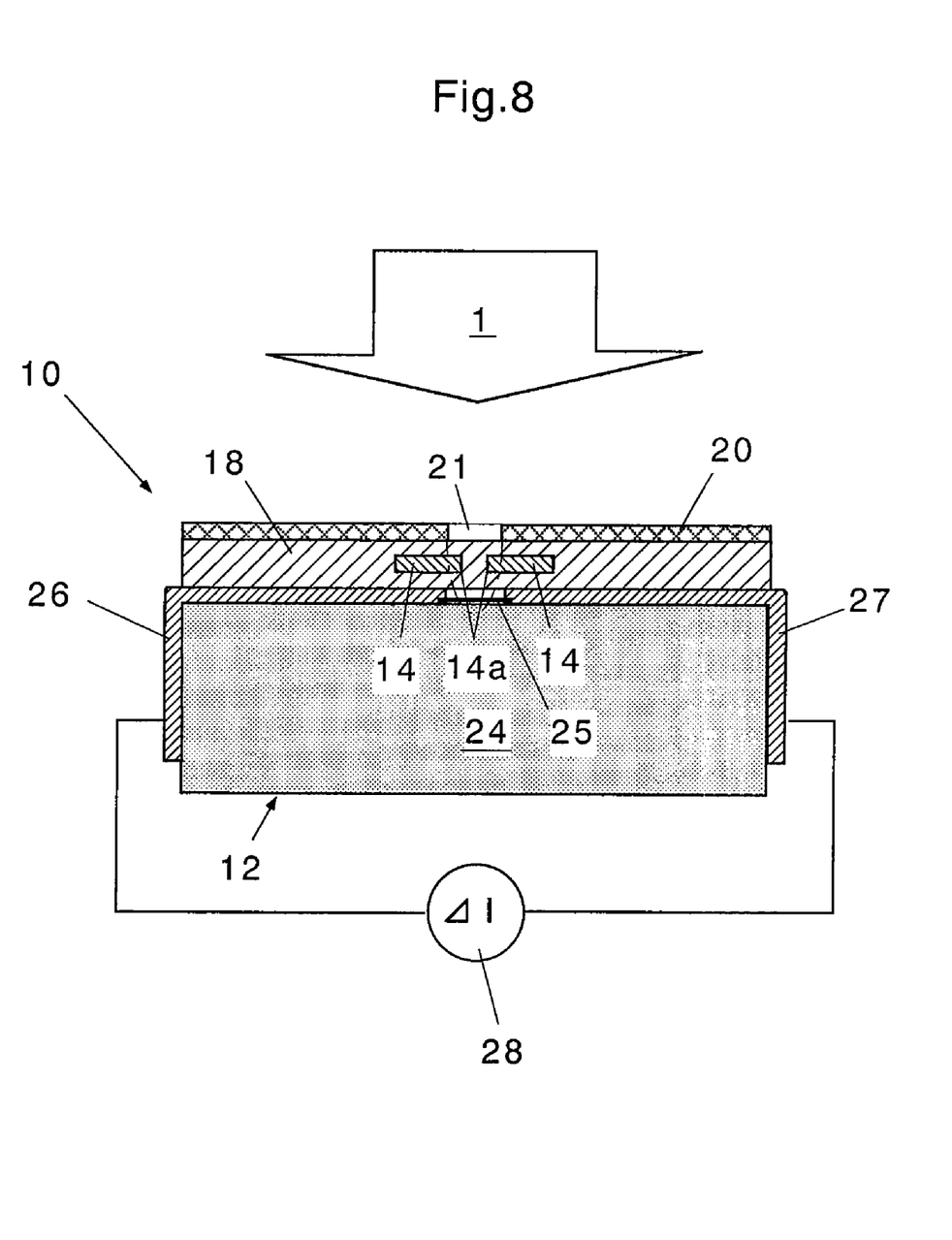
FIG. 8 is a diagram of a second embodiment of a near-field terahertz wave detector according to the present invention.

Referring to FIG. 8, there is shown a diagram of a second embodiment of a near-field terahertz wave detector according to the present invention.

In this example, the semiconductor chip 12 is made from a semiconductor substrate 24 and a carbon nanotube 25. The semiconductor substrate 24 is, for example, a Si substrate.

Moreover, the carbon nanotube 25 is located on the surface of the semiconductor substrate 24 and has the property that the longitudinal electrical resistance along the surface changes due to the near-field wave of the terahertz wave.

Further, in this example, the near-field terahertz wave detector includes a conductive source electrode 26, a conductive drain electrode 27, and a current measuring device 28.

In this example, the source electrode 26 and the drain electrode 27 are connected to both longitudinal ends of the carbon nanotube 25 and disposed in close contact with the surface of the semiconductor substrate 24.

Moreover, the current measuring device 28 detects a change in current between the source electrode 26 and the drain electrode 27 by applying a certain voltage therebetween.

Other components are the same as those of the first embodiment.

According to the above configuration, the carbon nanotube is capable of higher sensitive detection than the two-dimensional electron gas as a detection unit, and therefore it is possible to improve the high spatial resolution and to achieve highly sensitive detection by further decreasing the maximum size of the aperture described above.

The present invention is not limited to the above examples and embodiments, and naturally it is intended to include various variations and modifications within the spirit and scope of the invention.

What is claimed is:

1. A near-field terahertz wave detector, comprising:
   (a) a semiconductor chip whose longitudinal electrical resistance along a surface of the semiconductor chip changes due to a near-field wave generated inside the detector by a terahertz wave irradiated from outside the detector;
   (b) an insulating film that covers the surface of the semiconductor chip; and
   (c) a conductive film able to shield the terahertz wave by covering the surface of the insulating film,
   wherein the conductive film has an aperture whose maximum size is one digit or more smaller than the wavelength of the terahertz wave and
   wherein a pair of planar conductive probes are provided between the conductive film and the semiconductor chip, wherein the conductive probes are insulated from the conductive film by the insulating film, and inner tips of the conductive probes are located inside the aperture, wherein the conductive probes are located along the surface of the semiconductor chip, and a center position of the aperture coincides with a center of the pair of inner tips and an outer edge of the aperture is located outside of the pair of inner tips.

2. The near-field terahertz wave detector according to claim 1, wherein the tips of the conductive probes are opposed to each other with a gap between the tips that is one digit or more smaller than the wavelength of the terahertz wave.

3. The near-field terahertz wave detector according to claim 2,
   wherein the semiconductor chip is a high electron mobility transistor (HEMT) in which a two-dimensional electron gas is formed in a given position from the surface, and
   wherein the near-field terahertz wave detector further comprises:
      (d) conductive source and drain electrodes that are spaced apart from each other on a longitudinal outside of the pair of conductive probes placed between the source electrode and the drain electrode, both of which are disposed in close contact with the surface of the semiconductor chip; and
      (e) a voltage measuring device that detects a change in voltage between the source electrode and the drain electrode by applying a certain electric current therebetween.

4. The near-field terahertz wave detector according to claim 2,
   wherein the semiconductor chip includes a semiconductor substrate and a carbon nanotube that is located on the surface of the semiconductor substrate and whose longitudinal electrical resistance along the surface changes due to the near-field wave of the terahertz wave, and
   wherein the near-field terahertz wave detector further comprises:
      (d) conductive source and drain electrodes that are connected to both longitudinal ends of the carbon nanotube and disposed in close contact with the surface of the semiconductor substrate; and
      (e) a current measuring device that detects a change in current between the source electrode and the drain electrode by applying a certain voltage therebetween.

5. The near-field terahertz wave detector according to claim 3, wherein the semiconductor chip, the source electrode, the drain electrode, the conductive probes, the insulating film, and the conductive film are formed together and integrated in this order.

6. The near-field terahertz wave detector according to claim 4, wherein the semiconductor chip, the source electrode, the drain electrode, the conductive probes, the insulating film, and the conductive film are formed together and integrated in this order.

* * * * *